United States Patent
Balon

(10) Patent No.: US 7,134,589 B2
(45) Date of Patent: Nov. 14, 2006

(54) WIRE BONDER WITH A DOWNHOLDER FOR PRESSING THE FINGERS OF A SYSTEM CARRIER ONTO A HEATING PLATE

(75) Inventor: Stéphane Balon, Rotkreuz (CH)

(73) Assignee: Unaxis International Trading Ltd., Cham (CH)

( * ) Notice: Subject to any disclaimer, the term of this patent is extended or adjusted under 35 U.S.C. 154(b) by 0 days.

(21) Appl. No.: 10/949,672

(22) Filed: Sep. 24, 2004

(65) Prior Publication Data

US 2005/0067462 A1 Mar. 31, 2005

(30) Foreign Application Priority Data

Sep. 25, 2003 (CH) .................................... 1648/03

(51) Int. Cl.
*B23K 37/04* (2006.01)

(52) U.S. Cl. ................... 228/4.5; 228/44.7; 228/49.5

(58) Field of Classification Search .............. 228/112.1, 228/4.5
See application file for complete search history.

(56) References Cited

U.S. PATENT DOCUMENTS

| | | | |
|---|---|---|---|
| 4,765,531 A | 8/1988 | Ricketson et al. | |
| 4,896,811 A | 1/1990 | Dunn et al. | |
| 5,108,023 A | 4/1992 | Japichino et al. | |
| 5,176,311 A | 1/1993 | Levine et al. | |
| 5,193,733 A * | 3/1993 | You ........................... | 228/4.5 |
| 5,307,977 A | 5/1994 | Park | |
| 5,316,204 A | 5/1994 | Takehashi et al. | |
| 5,450,996 A * | 9/1995 | Helton et al. .................. | 228/50 |
| 5,611,478 A | 3/1997 | Asanasavest | |
| 5,660,318 A * | 8/1997 | Jung et al. ................... | 228/102 |
| 6,047,468 A * | 4/2000 | Fogal et al. ................... | 29/827 |
| 6,478,211 B1 | 11/2002 | Ball et al. | |
| 6,645,346 B1 * | 11/2003 | Mii et al. ................. | 156/583.1 |
| 6,715,659 B1 * | 4/2004 | Ball ............................ | 228/4.5 |

FOREIGN PATENT DOCUMENTS

| | | |
|---|---|---|
| CH | 680176 A5 | 6/1992 |
| EP | 0541 116 B1 | 5/1993 |
| JP | 64-028829 | 1/1989 |
| JP | 8153744 | 6/1996 |
| JP | 11260853 | 9/1999 |
| JP | 11260854 | 9/1999 |

* cited by examiner

*Primary Examiner*—Jonathan Johnson
(74) *Attorney, Agent, or Firm*—McCormick, Paulding & Huber LLP

(57) ABSTRACT

A Wire Bonder has a downholder for pressing the fingers of a system carrier onto a heating plate. The downholder can be raised and lowered. A downholder in accordance with the invention contains four guide elements for bearing a holding plate, whereby each guide element has a supporting surface and a bolt that can be moved by means of a drive. In the raised condition of the downholder, the holding plate rests on the supporting surfaces of the four guide elements. In the lowered condition of the downholder, the bolts of the four guide elements press the holding plate against the fingers of the system carrier presented on the heating plate. At least one of the four bolts can be moved separately so that the holding plate can temporarily anchor the system carrier without already pressing all fingers against the heating plate.

1 Claim, 3 Drawing Sheets

WIRE BONDER WITH A DOWNHOLDER FOR PRESSING THE FINGERS OF A SYSTEM CARRIER ONTO A HEATING PLATE

PRIORITY CLAIM

Applicant hereby claims foreign priority under 35 U.S.C § 119 from Swiss Patent Application No. 01648/03 filed Sep. 25, 2003, the disclosure of which is herein incorporated by reference.

FIELD OF THE INVENTION

The invention concerns a Wire Bonder with a downholder for pressing the fingers of a system carrier, in particular a leadframe, onto a heating plate.

BACKGROUND OF THE INVENTION

With the production of electrical wire connections between a semiconductor chip and a system carrier, known in technical jargon as wire bonding, the fingers of the system carrier to be bonded are pressed against a heating plate by means of a holding plate. The holding plate has a window so that the ends of the fingers are accessible for bonding.

A Wire Bonder is a machine with which semiconductor chips are wired after mounting on a substrate. The Wire Bonder has a capillary that is clamped to the tip of a horn. The capillary serves to secure the wire to a connection point on the semiconductor chip and to a connection point on the substrate as well as to guide the wire between the two connection points. On producing the wire connection between the connection point on the semiconductor chip and the connection point on the substrate, the end of the wire protruding out of the capillary is first melted into a ball. Afterwards, the wire ball is secured to the connection point on the semiconductor chip by means of pressure and ultrasonics. In doing so, ultrasound is applied to the horn from an ultrasonic transducer. This process is called ball bonding. The wire is then pulled through to the required length, formed into a wire loop and bonded to the connection point on the substrate. This last part of the process is called wedge bonding. After securing the wire to the connection point on the substrate, the wire is torn off and the next bonding cycle can begin.

A downholder with which the holding plate has a movable bearing in order to achieve a uniform pressing of the fingers onto the supporting surface is known from the Swiss patent specification CH 680 176. This downholder does good service for system carriers with which the average distance between neighbouring fingers, known in technical jargon as the pitch, does not fall below a certain value. With a pitch of 50, 40 or only 25 micrometers however, considerable problems arise in particular because of the different thermal expansion coefficients of system carrier and holding or heating plate.

The object of the invention is to develop a downholder that is suitable for the processing of system carriers with an extremely small pitch of 40 micrometers or less.

SUMMARY OF THE INVENTION

A Wire Bonder has a heating plate on which the system carrier with the semiconductor chips to be wired is presented and a downholder for pressing the fingers of the system carrier onto the heating plate. The downholder comprises an exchangeable holding plate and can be raised and lowered. The system carrier can be transported in the raised condition of the downholder. The wiring of the semiconductor chips takes place in the lowered condition of the downholder. In accordance with the invention, the downholder is equipped with four guide elements for bearing the holding plate. Each guide element has a supporting surface and a bolt or pin or similar that can be moved by means of a drive. In the raised condition of the downholder, the holding plate rests on the supporting surfaces of the four guide elements and the bolts are also raised so that they do not touch the holding plate. Lowering of the downholder takes place in two steps. In the first step, the downholder is lowered whereby one of the bolts is also lowered and presses on the holding plate while the other bolts are raised and do not touch the holding plate or at least exert no force on the holding plate. Because, on lowering, the holding plate impacts on the fingers of the system carrier, it is tilted by a contact point. After the first step, the holding plate therefore only presses against one or a few neighbouring fingers. On heating to the predetermined temperature the other fingers can move freely relative to the heating plate. As soon as the predetermined temperature has almost been reached, the inclination of the holding plate is cancelled. This is done in that all bolts of the four guide elements are lowered so that they press onto the holding plate. In the lowered condition of the downholder, the bolts of the four guide elements now press the holding plate against the fingers of the system carrier presented on the heating plate.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE PREFERRED EMBODIMENTS

Figure 1:
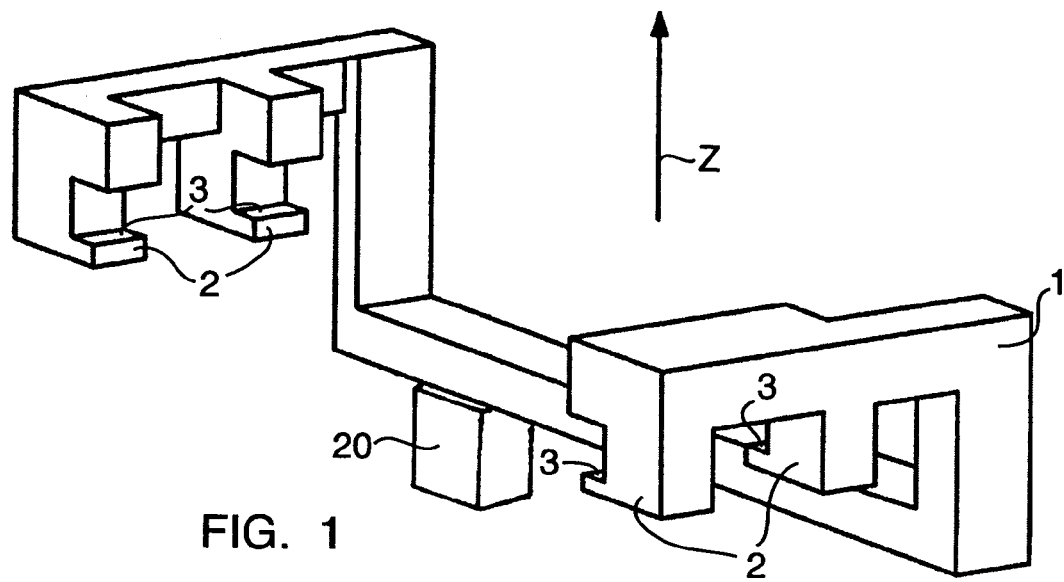
FIG. 1 shows a perspective view of a downholder.

FIG. 1 shows a perspective view of a downholder 1 for accepting a (not presented) holding plate. The downholder 1 is used on a Wire Bonder during wire bonding in order to press the fingers of a system carrier against a heating plate. The Wire Bonder has a drive 20 for raising and lowering the downholder 1 in the vertical direction, designated as z direction, between two predetermined positions. When the downholder 1 is raised, then the system carrier can be supplied to the heating plate or be transported away from the heating plate. When the downholder 1 is lowered, then the holding plate presses the fingers of the system carrier against the heating plate. The downholder 1 has four guide elements 2 on which the holding plate bears. The form and function of the guide elements is explained in more detail based on FIGS. 2, 3 and 4. In all figures, identical reference marks designate the same parts.

Figure 2:
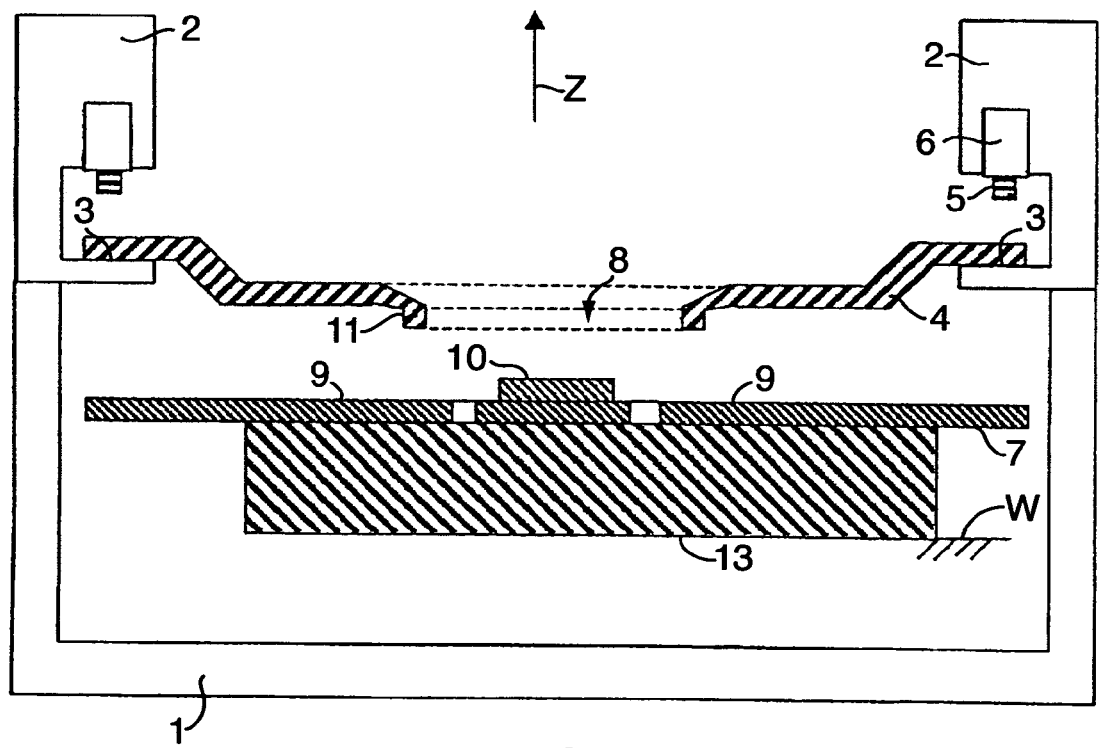
FIG. 2 shows a side view of the raised downholder.

FIG. 2 shows a side view of the downholder 1 raised in z direction. The guide elements 2 each comprise a supporting surface 3 on which the holding plate 4 rests in the raised condition of the downholder 1. The four supporting surfaces 3 define one plane. Each of the guide elements 2 further comprises one bolt 5 and one drive 6 in order to move the bolt 5 up and down in z direction. The bolts 5 of the four guide elements 2 are raised so that they do not touch the holding plate 4. In this condition, the system carrier 7 can be transported. The holding plate 4 has a window 8 so that the ends of the fingers 9 of the system carrier 7 are accessible for the wiring of the semiconductor chip 10. The window 8 of the holding plate 4 is surrounded by a continuous frame 11 on the side facing towards the system carrier 7. The frame 11 and the holding plate 4 run essentially parallel to the surface of the heating plate 13. The heating plate 13 is rigidly arranged on the Wire Bonder W. Wiring of the semiconductor chips takes place at temperatures that, for metallic leadframes, lie in the range of around 220° C. The heating plate 13 is heated to this temperature. The system carrier 7 is preheated, however cools down rapidly during transport so that its temperature immediately after completion of the transport process can easily be 60° lower than the temperature of the heating plate 13. The system carrier 7 has to be heated to the predetermined temperature by the heating plate 13 which takes a certain time.

Figure 3:
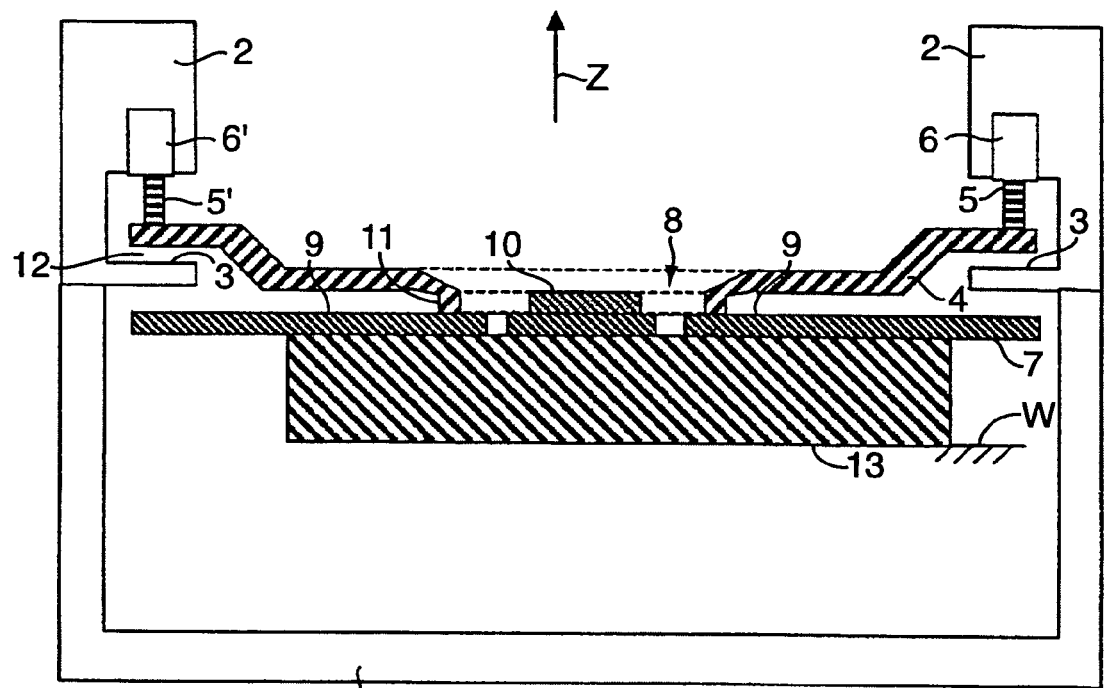
FIG. 3 shows a side view of the lowered downholder in a condition in which the wiring of a semiconductor chip takes place.
Figure 4:
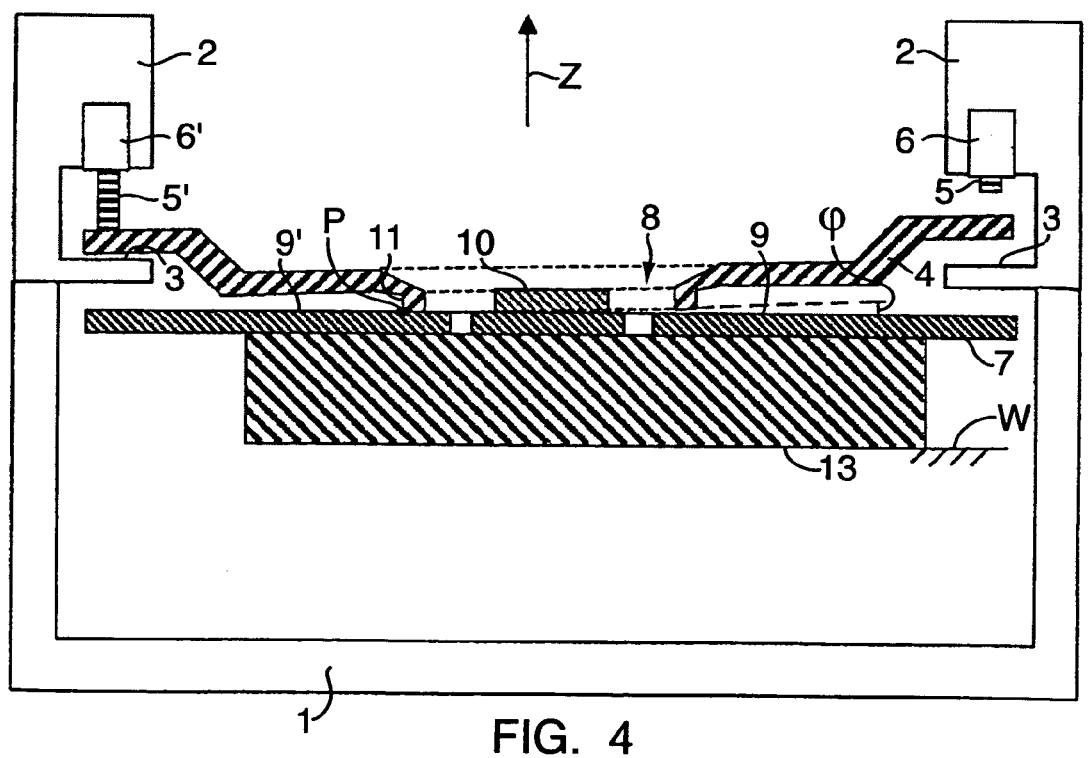
FIG. 4 shows a side view of the lowered downholder in a further condition.

FIG. 3 shows a side view of the downholder 1 lowered in the z direction in the condition in which the frame 11 surrounding the window 8 rests on the fingers 9 of the system carrier 7 and presses the fingers 9 against the heating plate 13. The holding plate 4 no longer rests on the supporting surfaces 3 of the guide elements 2, ie, an air gap 12 exists between the supporting surfaces 3 and the holding plate 4. In order to produce the necessary contact pressure with which the holding plate 4 presses the fingers 9 against the heating plate 13, the bolts 5 of the four guide elements 2 are lowered by the assigned drives 6 in z direction so that they press against the holding plate 4.

In production, the system carrier 7 is transported in steps in transport direction and each time presents a next semiconductor chip 10 on the heating plate 13 for wire bonding whereby the downholder 1 is in the condition presented in FIG. 2. As soon as the transport process is concluded, the downholder 1 is lowered and is brought in two steps firstly into the condition presented in FIG. 4 and finally into the condition presented in FIG. 3.

At the start of lowering the downholder 1, all bolts 5 of the four guide elements 2 are raised and do not touch the holding plate 4. During lowering or immediately after lowering the holding plate 4 one of the four bolts 5, namely bolt 5', is lowered by the corresponding drive 6' so that it presses against the holding plate 4 after the frame 11 comes to rest on the fingers 9' of the system carrier 7. This has the effect that the holding plate 4 is tilted by the point P of the frame 11 coming closest to the bolt 5'. The frame 11 and the holding plate 4 therefore run inclined to the surface of the heating plate 13 at an angle _. The holding plate 4 is therefore in an inclined position. The frame 11 therefore only presses one or a few of the point P neighbouring fingers 9' against the heating plate 13 while the remaining fingers 9 are not yet clamped between the frame 11 and the heating plate 13. The downholder 1 remains in this condition for a predetermined time _, namely until the system carrier 7 is heated to the temperature of the heating plate 13 or at least almost to the temperature of the heating plate 13. On heating, the system carrier 7 expands whereby the fingers 9 that are not clamped can move relative to the heating plate 13.

After the predetermined time duration _ has expired, the bolts 5', 5 of the four guide elements 2 are all lowered so that they all press against the holding plate 4. This has the effect that the frame 11 is tilted back and all fingers 9 are pressed evenly against the heating plate 13. The downholder 1 is now in the condition presented in FIG. 3.

The movement of the bolts 5 in z direction can take place either displacement-controlled or force-controlled, ie, either the bolt 5 is moved by the assigned drive 6 to a predetermined z position or the bolt 5 is moved by the assigned drive 6 in z direction until a predetermined force acts against it. The forces exerted by the bolts 5 on the holding plate 4 can be selected either equally strong for all bolts 5 or of different strengths. The drives of the bolts 5 can be of any type, for example pneumatic or piezoelectric or with an electromagnetic motor.

It is possible to move the one bolt 5' separately and the other three bolts 5 up and down together or it is possible to move all four bolts 5', 5 individually. Furthermore, it is possible in the first step of the lowering process to lower two of the four bolts 5 simultaneously so that not the individual point P but one edge of the frame 11 comes to rest on the system carrier 7 and the holding plate 4 is tilted by this edge. The drives 6 for moving the bolts 5', 5 are controlled by a control unit of the Wire Bonder.

Figure 5:
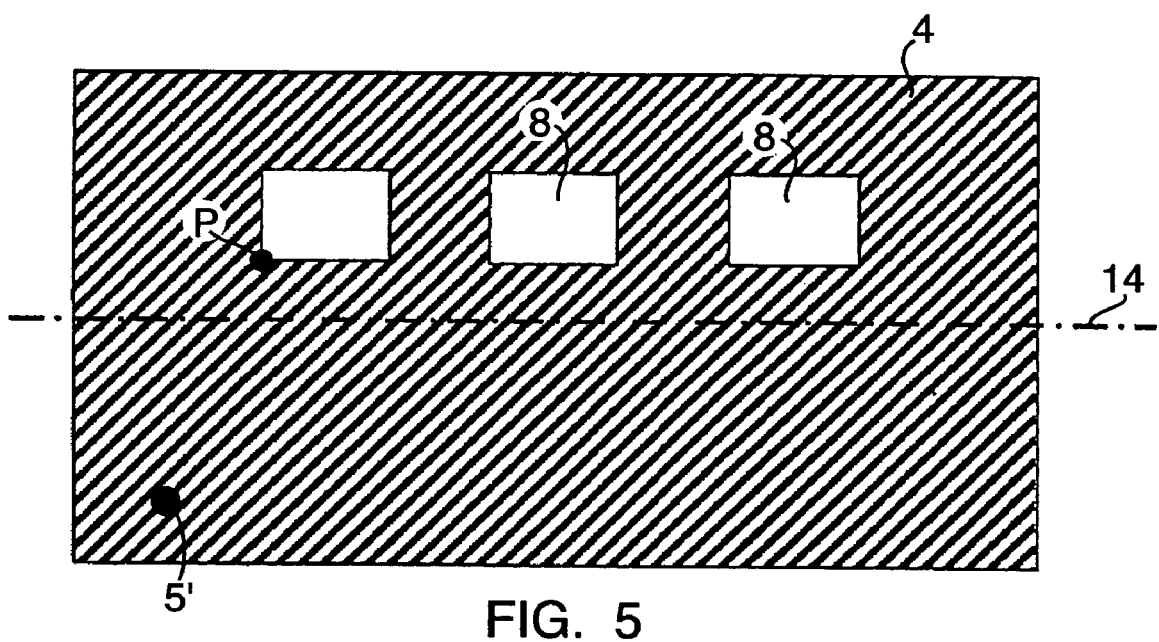
FIG. 5 shows a holding plate with several windows.

There are also applications with which the holding plate 4 has several windows 8 each with a surrounding frame 11 so that during a working cycle several semiconductor chips lying within the movement range of the bondhead of the Wire Bonder can be wired. In addition, there are applications with which the windows 8 are arranged asymmetrically in relation to a longitudinal axis 14 of the holding plate 4. FIG. 5 shows such a holding plate 4. Also presented are the bolts 5' that are lowered in the first step of lowering the downholder 1 and the point P by which the holding plate 4 is tilted.

Preferably, the holding plate 4 has cavities into which the bolts 5 engage so that the position of the holding plate 4 is automatically adjusted in relation to the downholder 1.

The invention offers several advantages:

The thermal expansion of a metallic leadframe in the working range of the bondhead of the Wire Bonder amounts typically to several 10 micrometers in both horizontal directions. The invention makes it possible that the leadframe can expand unhindered during heating and that the fingers 9 of the leadframe are only clamped when the thermal expansion is completed or almost completed. Nevertheless, the leadframe is fixed at one location. This makes it possible to already start the optical measurement of the position of the fingers 9', 9 whereby the fingers next to the point P are measured first.

The clamping of the fingers 9 takes place independently of the position of the windows 8 or the windows relative to the holding plate 4. There are namely applications with which the windows 8 are arranged asymmetrically on the holding plate 4.

The force with which the fingers 9 are pressed against the heating plate 13 is independent of the thickness of the system carrier 7 and therefore independent of variations in this thickness.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A wire bonder, comprising
a heating plate,
a downholder for pressing the fingers of a system cater presented on the heating plate onto the heating plate, the downholder having four guide elements for bearing a holding plate, wherein each guide element comprises a supporting surface, a bolt and a drive for moving the bolt,
a drive for raising and lowering the downholder, wherein in a raised condition of the downholder the holding plate rests on the supporting surfaces of the four guide elements and wherein in a lowered condition of the downholder the bolts of the four guide elements press the holding plate against the fingers of the system carrier, and
a control unit controlling the drives for moving the bolts, the control unit adapted to control the drives for moving the bolt such that at least one of the four bolts can be moved separately from the other bolts.

* * * * *

UNITED STATES PATENT AND TRADEMARK OFFICE
CERTIFICATE OF CORRECTION

PATENT NO.          : 7,134,589 B2                                      Page 1 of 1
APPLICATION NO.  : 10/949672
DATED                  : November 14, 2006
INVENTOR(S)        : Stephane Balon It is certified that error appears in the above-identified patent and that said Letters Patent is hereby corrected as shown below:

Column 5, line 8, please delete the word "cater" and replace it with the word --carrier--.

Signed and Sealed this

Twenty-seventh Day of February, 2007

JON W. DUDAS
*Director of the United States Patent and Trademark Office*